(12) United States Patent
Xue et al.

(10) Patent No.: US 11,609,277 B2
(45) Date of Patent: Mar. 21, 2023

(54) POWER GLITCH SIGNAL DETECTION CIRCUIT AND SECURITY CHIP

(71) Applicant: SHENZHEN GOODIX TECHNOLOGY CO., LTD., Shenzhen (CN)

(72) Inventors: Jianfeng Xue, Shenzhen (CN); Jiang Yang, Shenzhen (CN)

(73) Assignee: SHENZHEN GOODIX TECHNOLOGY CO., LTD., Shenzhen (CN)

(*) Notice: Subject to any disclaimer, the term of this patent is extended or adjusted under 35 U.S.C. 154(b) by 431 days.

(21) Appl. No.: 17/026,209

(22) Filed: Sep. 19, 2020

(65) Prior Publication Data

US 2021/0003639 A1   Jan. 7, 2021

Related U.S. Application Data

(63) Continuation of application No. PCT/CN2019/092503, filed on Jun. 24, 2019.

(51) Int. Cl.
*G01R 31/40* (2020.01)
*G01R 19/165* (2006.01)
(Continued)

(52) U.S. Cl.
CPC ....... *G01R 31/40* (2013.01); *G01R 19/16519* (2013.01); *G06F 1/28* (2013.01); *H03K 3/037* (2013.01)

(58) Field of Classification Search
CPC .......... G01R 31/008; G01R 19/0092; G01R 19/165; G01R 31/72; H01F 7/1844; H01F 2007/1855; F02C 7/232; G01M 15/14
(Continued)

(56) References Cited

U.S. PATENT DOCUMENTS

| 5,374,923 A | 12/1994 | Sakamoto |
| 5,703,510 A | 12/1997 | Iketani et al. |

(Continued)

FOREIGN PATENT DOCUMENTS

| CN | 2922277 Y | 7/2007 |
| CN | 101943728 A | 1/2011 |

(Continued)

OTHER PUBLICATIONS

Liu Faen, "Key Technique Research for RF and Millimeter-wave PLL Integrated Circuits Based on CMOS Technology," Chinese Doctoral Dissertations & Master's Theses Full-text Database (Doctor)—Information Science and Technology, Aug. 5, 2016, pp. 1-126.

(Continued)

*Primary Examiner* — Farhana A Hoque (57) ABSTRACT

A power glitch signal detection circuit, a security chip and an electronic apparatus are disclosed. The power glitch signal detection circuit comprises: a latch and a signal output module, wherein a first input of the latch is connected to a power supply voltage, a first output of the latch is connected to a ground voltage, a second input of the latch is connected to a third output of the latch, a third input of the latch is connected to a second output of the latch, and the second output or the third output is connected to the signal output module. The power glitch signal detection circuit could detect a power glitch on the power supply voltage or the ground voltage, and the power glitch signal detection circuit has the advantages of low power consumption, small area, high speed, high sensitivity and strong portability.

20 Claims, 3 Drawing Sheets

(51) Int. Cl.
*G06F 1/28* (2006.01)
*H03K 3/037* (2006.01)

(58) Field of Classification Search
USPC .................................................. 324/764.01
See application file for complete search history.

(56) References Cited

U.S. PATENT DOCUMENTS

| | | | |
|---|---|---|---|
| 6,751,079 B2 | 6/2004 | Bretschneider | |
| 6,990,010 B1 | 1/2006 | Plants | |
| 7,126,842 B2 | 10/2006 | Plants | |
| 7,301,320 B2 | 11/2007 | Dreps et al. | |
| 7,403,411 B1 | 7/2008 | Plants | |
| 7,409,659 B2 | 8/2008 | Chakraborty et al. | |
| 7,672,153 B2 | 3/2010 | Plants | |
| 7,719,325 B1 | 5/2010 | Wang et al. | |
| 10,156,595 B2 | 12/2018 | Nirwan et al. | |
| 10,277,213 B1 * | 4/2019 | Kimelman | H03K 5/1252 |
| 2006/0107245 A1 | 5/2006 | Chakraborty et al. | |
| 2006/0126376 A1 | 6/2006 | Plants | |
| 2006/0164059 A1 | 7/2006 | Dreps et al. | |
| 2008/0012603 A1 | 1/2008 | Wadhwa et al. | |
| 2008/0018368 A1 | 1/2008 | Wadhwa et al. | |
| 2008/0061843 A1 | 3/2008 | Yanci | |
| 2008/0298116 A1 | 12/2008 | Plants | |
| 2010/0123501 A1 | 5/2010 | Wang et al. | |
| 2013/0193981 A1 | 8/2013 | Chen et al. | |
| 2019/0131960 A1 | 5/2019 | Kimelman | |

FOREIGN PATENT DOCUMENTS

| | | |
|---|---|---|
| CN | 101996580 A | 3/2011 |
| CN | 101943729 B | 3/2012 |
| CN | 103034804 A | 4/2013 |
| CN | 103675421 A | 3/2014 |
| CN | 104166053 A | 11/2014 |
| CN | 104459564 A | 3/2015 |
| CN | 104639122 A | 5/2015 |
| CN | 104714193 A | 6/2015 |
| CN | 103034804 B | 12/2015 |
| CN | 204964722 U | 1/2016 |
| CN | 106571803 A | 4/2017 |
| CN | 104459564 B | 9/2017 |
| CN | 108139507 A | 6/2018 |
| CN | 108169694 A | 6/2018 |
| CN | 108508953 A | 9/2018 |
| CN | 108599757 A | 9/2018 |
| CN | 109257036 A | 1/2019 |
| CN | 109314464 A | 2/2019 |
| CN | 109541288 A | 3/2019 |
| CN | 109709475 A | 5/2019 |
| JP | 2004236407 A | 8/2004 |
| KR | 20000007158 A | 2/2000 |

OTHER PUBLICATIONS

Fu Qiang et al., "Intelligent Switcher Design in Water and Fertilizer Integration Equipment," Transactions of the Chinese Society for Agricultural Machinery S1(2015): 108-115, Dec. 30, 2015, pp. 108-115.

Beringuier-Boher, Noémie et al: "Voltage Glitch Attacks on Mixed-Signal Systems," 2014 17th Euromicro Conference on Digital System Design, IEEE, Aug. 27, 2014, pp. 379-386, doi: 10.1109/DSD.2014.14 [retrieved on Oct. 16, 2014].

* cited by examiner

FIG. 4 ically, the glitch signal detection circuit needs structures including a resistance-capacity (RC) sampling structure and a comparator structure. The RC sampling structure samples the power supply voltage (or ground voltage) using a low-pass filter, and the comparator structure sets a decision threshold with a resistor divider and decides whether to trigger an alarm by comparing the sampled power supply voltage (or ground voltage) with the decision threshold. The advantage of the RC sampling structure is that it can detect a nanosecond (ns)-level power glitch, but the RC sampling structure with a larger RC generally requires a larger chip area overhead. The advantage of the comparator structure is that the decision threshold can be set accurately, but a static bias current in the comparator structure may cause a static bias power consumption. In addition, the power glitch signal detection circuit in prior art has disadvantages of low reaction rate, low sensitivity and poor portability.

POWER GLITCH SIGNAL DETECTION CIRCUIT AND SECURITY CHIP

CROSS REFERENCE TO RELATED APPLICATIONS

The present disclosure is a continuation of international application No. PCT/CN2019/092503, filed on Jun. 24, 2019, which is hereby incorporated by reference in its entirety.

TECHNICAL FIELD

Embodiments of the present disclosure relates to the field of electronic technologies, and in particular, to a power glitch signal detection circuit, a security chip and an electronic apparatus.

BACKGROUND

A security chip can be used to implementation functions such as user identification and key data storage, which is widely used in a financial field, and is a key target of an attacker.

The attacker may make the chip work in an abnormal state by a fault attack (such as a power glitch attack), which leads to a wrong operation of the chip. At this point, the attacker can easily obtain confidential data in the security chip using a fault analysis technology.

Under normal conditions, a glitch signal detection circuit can detect a power glitch on power supply voltage (or ground voltage), and give an alarm signal in time, thereby increasing the robustness and safety of the system on chip. Specifically, the glitch signal detection circuit needs structures including a resistance-capacity (RC) sampling structure and a comparator structure. The RC sampling structure samples the power supply voltage (or ground voltage) using a low-pass filter, and the comparator structure sets a decision threshold with a resistor divider and decides whether to trigger an alarm by comparing the sampled power supply voltage (or ground voltage) with the decision threshold. The advantage of the RC sampling structure is that it can detect a nanosecond (ns)-level power glitch, but the RC sampling structure with a larger RC generally requires a larger chip area overhead. The advantage of the comparator structure is that the decision threshold can be set accurately, but a static bias current in the comparator structure may cause a static bias power consumption. In addition, the power glitch signal detection circuit in prior art has disadvantages of low reaction rate, low sensitivity and poor portability.

SUMMARY

The present disclosure provides a power glitch signal detection circuit, a security chip and an electronic apparatus, which could detect a power glitch on power supply voltage or ground voltage, and the power glitch signal detection circuit has the advantages of low power consumption, small area, high speed, high sensitivity and strong portability.

In a first aspect, a power glitch signal detection circuit is provided, comprising:
a latch and a signal output module,
wherein a first input of the latch is connected to a power supply voltage, a first output of the latch is connected to a ground voltage, a second input of the latch is connected to a third output of the latch, a third input of the latch is connected to a second output of the latch, and the second output or the third output is connected to the signal output module;
wherein when there is no power glitch signal on the power supply voltage and no power glitch signal on the ground voltage, the latch is configured to maintain a voltage value of the second input at a first voltage and maintain a voltage value of the third input at a second voltage, wherein the first voltage is greater or less than the second voltage;
wherein the signal output module is configured to generate and output a target signal according to change of the voltage value of the third input, and the target signal is used to indicate whether there is a power glitch signal on the power supply voltage or the ground voltage.

Detecting a power glitch on the power supply voltage or the ground voltage based on the latch is different from the traditional RC sampling structure and the comparator structure. Specifically, the latch does not need to use a resistor so that the area of the power glitch signal detection circuit and the hardware overhead can be reduced; a positive feedback characteristic of the latch can improve the detection speed of the power glitch signal detection circuit; compared with the resistance-capacitance structure, a negative resistance sluggish characteristic of the latch can detect a glitch signal with a lower amplitude, thereby improving the sensitivity of the power glitch signal detection circuit; the static current of the latch is only the leakage current of the used device, and there is no static bias current, which can reduce static power consumption of the power glitch signal detection circuit; and the latch can be compatible with a digital (Complementary Metal-Oxide-Semiconductor Transistor, CMOS) process, which can enhance the portability of the glitch signal detection circuit. In short, the power glitch signal detection circuit could detect a power glitch on the power supply voltage or the ground voltage, and the power glitch signal detection circuit has the advantages of low power consumption, small area, high speed, high sensitivity and strong portability.

In some possible implementation manners, when there is no positive power glitch signal on the power supply voltage and no negative power glitch signal on the ground voltage, then the voltage value of the third input does not change, and the signal output module is configured to generate and output a first signal, and the first signal is used to indicate that there is no power glitch signal on the power supply voltage or the ground voltage; when there is a positive power glitch signal on the power supply voltage and/or a negative power glitch signal on the ground voltage, then the voltage value of the third input changes, and the signal output module is configured to generate and output a second signal according to change of the voltage value of the third input, and the second signal is used to indicate that there is a power glitch signal on the power supply voltage or the ground voltage.

In some possible implementation manners, the power glitch signal detection circuit further comprises:
a capacitor, wherein the second input of the latch is connected to the ground voltage through the capacitor.

Based on the latch-capacitor (Latch-C) structure, the voltage value of the second input N of the latch can be made to be "1".

In some possible implementation manners, the latch comprises:
a first metal oxide semiconductor MOS transistor, a second MOS transistor, a third MOS transistor and a fourth MOS transistor, wherein a source terminal of the first MOS transistor is connected to the power supply voltage, a gate terminal of the first MOS transistor is connected to a gate terminal of the third MOS transistor, a drain terminal of the first MOS transistor is connected to a drain terminal of the third MOS transistor, a source terminal of the third MOS transistor is connected to the ground voltage, a source terminal of the second MOS transistor is connected to the power supply voltage, a gate terminal of the second MOS transistor is connected to a gate terminal of the fourth MOS transistor, a drain terminal of the second MOS transistor is connected to a drain terminal of the fourth MOS transistor, a source terminal of the fourth MOS terminal is connected to the ground voltage, the gate terminal of the first MOS transistor is connected to the drain terminal of the second MOS transistor, and the gate terminal of the second MOS transistor is connected to the drain terminal of the first MOS transistor.

In some possible implementation manners, the power glitch signal detection circuit further comprises:

a fifth MOS transistor, wherein a gate terminal of the fifth MOS transistor is connected to the power supply voltage, a source terminal of the fifth MOS transistor is connected to the second input, and a drain terminal of the fifth MOS transistor is connected to the third input.

In some possible implementation manners, when there is no negative power glitch signal on the power supply voltage and no positive power glitch signal on the ground voltage, then the voltage value of the third input does not change, and the signal output module is configured to generate and output a third signal, and the third signal is used to indicate that there is no power glitch signal on the power supply voltage or the ground voltage; when there is a negative power glitch signal on the power supply voltage and/or a positive power glitch signal on the ground voltage, then the voltage value of the third input changes, and the signal output module is configured to generate and output a fourth signal according to change of the voltage value of the third input, and the fourth signal is used to indicate that there is a power glitch signal on the power supply voltage or the ground voltage.

The negative glitch on the power supply voltage and the positive glitch on the ground voltage can be detected using the fifth MOS transistor. In other word, bidirectional power glitch detection can be implemented with the latch in cooperation with the fifth MOS transistor.

In some possible implementation manners, the power glitch signal detection circuit further comprises:

an enable control circuit, wherein the enable control circuit is configured to control the latch to maintain the voltage value of the second input at the first voltage, and maintain the voltage value of the third input at the second voltage.

In some possible implementation manners, the enable control circuit further comprises:

a sixth MOS transistor and a seventh MOS transistor, wherein a source terminal of the sixth MOS transistor is connected to the power supply voltage, a drain terminal of the sixth MOS transistor is connected to the second input, a source terminal of the seventh MOS transistor is connected to the ground voltage, and a drain terminal of the seventh MOS transistor is connected to the third input.

In some possible implementation manners, the signal output module is a D trigger.

In some possible implementation manners, the power glitch signal detection circuit further comprises:

a threshold decision module, wherein the second output or the third output is connected to the signal output module through the threshold module, and the threshold decision module is configured to amplify a signal outputted by the second output or the third output and to transmit the amplified signal to the signal output module.

A lower amplitude glitch can be detected by the latch in cooperation with the threshold decision module, which can further increase the sensitivity of the power glitch signal detection circuit.

In some possible implementation manners, the a threshold decision module further comprises:

an eighth MOS transistor, a ninth MOS transistor, a tenth MOS transistor and an eleventh MOS transistor, wherein a source terminal of the eighth MOS transistor is connected to the power supply voltage, a gate terminal of the eighth MOS transistor is connected to a gate terminal of the tenth MOS transistor, a drain terminal of the eighth MOS transistor is connected to a drain of the tenth MOS transistor, a source terminal of the tenth MOS transistor is connected to the ground voltage, a source terminal of the ninth MOS transistor is connected to the power supply voltage, a gate terminal of the ninth MOS transistor is connected to a gate of the eleventh MOS transistor, a drain terminal of the ninth MOS transistor is connected to a drain terminal of the eleventh MOS transistor, a source terminal of the eleventh MOS terminal is connected to the ground voltage, the drain terminal of the eighth MOS transistor is connected to the gate terminal of the ninth MOS transistor, the gate terminal of the eighth MOS transistor is connected to the second output or the third output, and the gate terminal of the ninth MOS transistor is connected to the signal output module.

In some possible implementation manners, a width to length ratio of the eighth MOS transistor is less than a first preset threshold, a width to length ratio of the ninth MOS transistor is greater than a second preset threshold, a width of length ratio of the tenth MOS transistor is greater than a third preset threshold, and a width to length ratio of the eleventh MOS transistor is less than a fourth preset threshold, wherein the first preset threshold is less or equal to the third preset threshold and the second preset threshold is greater or equal to the fourth preset threshold.

In some possible implementation manners, the eight MOS transistor and the tenth MOS transistor form a first inverter, and the ninth MOS transistor and the eleventh MOS transistor form a second inverter, wherein an inverting threshold of the first inverter is less than that of the second inverter. For example, the inverting threshold of the first inverter is 0.3, and the inverting threshold of the second inverter is 0.8, that is, decreasing the inverting threshold of the first inverter and increasing the inverting threshold of the second inverter to increase the sensitivity of the power glitch signal detection circuit 100.

In a second aspect, a security chip is provided, comprising:

the power glitch signal detection circuit in the first aspect or any possible implementation manners of the first aspect.

In a third aspect, an electronic apparatus is provided, comprising:

the security chip according to the second aspect; and a processor, wherein the processor is configured to receive a target signal outputted by the security ship, and the target signal is used to indicate whether there is a power glitch signal on the power supply voltage or the ground voltage.

DESCRIPTION OF EMBODIMENTS

Technical solutions of embodiments of the present disclosure is hereinafter described with reference to the accompanying drawings.

A power glitch attack affects certain circuit units of a chip by quickly changing a power supply voltage or a ground voltage inputted to the chip, which causes one or more circuit units to enter an error state, then makes a processor in the chip skip an operation or perform a wrong operation according to the error state, and further exposes hidden security information in the chip.

Figure 1:
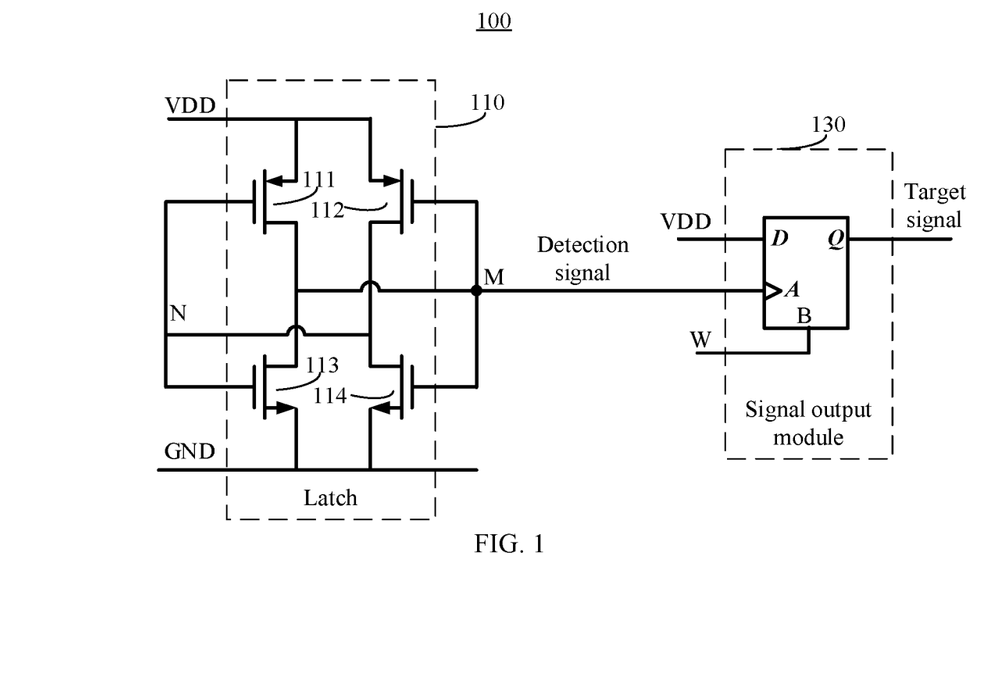
FIG. 1 and FIG. 2 are schematic circuit diagrams of a power glitch signal detection circuit of an embodiment of the present disclosure.

FIG. 1 is a schematic circuit diagram of a power glitch signal detection circuit of an embodiment of the present disclosure;

With reference to FIG. 1, the power glitch signal detection circuit 100 may include a latch 110 and a signal output module 130, wherein a first input of the latch 110 is connected to a power supply voltage VDD, a first output of the latch is connected to a ground voltage GND, a second input N of the latch 110 is connected to a third output of the latch, a third input M of the latch 110 is connected to a second output of the latch 110, and the second output or the third output is connected to the signal output module 130 (the accompanying drawing takes a second output connected to the signal output module 130 as an example). In other word, the latch 110 may include two inverters, the second input N and the second output are a gate terminal and a drain terminal of a MOS transistor of one of the two inverters respectively, and the third input M and the third output are a gate terminal and a drain terminal of a MOS transistor of the other inverter respectively.

A power glitch signal may be a regular or irregular pulse signal or spike signal included in an input waveform of a circuit. For example, a voltage value when there is a positive power glitch signal on a power supply voltage equals to a voltage value when there is no positive power glitch signal on the power supply voltage plus a voltage value of the power glitch signal. Again, for example, a voltage value when there is a negative power glitch signal on a power supply voltage equals to a voltage value when there is no power glitch signal on the power supply voltage minus a voltage value of the power glitch signal.

Similarly, a positive power glitch signal and a negative power glitch signal may also occur on a ground voltage.

As for an unstable power supply voltage, it can also be considered as a voltage of a stable power supply voltage plus a power glitch signal; as for an unstable ground voltage, it can also be considered as a voltage of a stable ground voltage plus a power glitch signal.

When there is no positive power glitch signal on the power supply voltage and no negative power glitch signal on the ground voltage, the latch 110 is configured to maintain the voltage value of the second input N at the first voltage and maintain the voltage value of the third input M at the second voltage; and the signal output module 130 is configured to generate and output a target signal according to change of the voltage value of the third input M, wherein the target signal is used to indicate whether there is a power glitch signal on the power supply voltage or the ground voltage.

The first voltage may be greater than the second voltage. For example, the first voltage is "1", and the second voltage is "0". Of course, the first voltage may also be less than the second voltage, for example, the first voltage is "0", and the second voltage is "1".

Detecting a power glitch on the power supply voltage or the ground voltage based on the latch 100 is different from the traditional RC sampling structure and the comparator structure. Specifically, the latch 110 does not need to use a resistor so that the area of the power glitch signal detection circuit 100 and the hardware overhead can be reduced; a positive feedback characteristic of the latch 100 can improve the detection speed of the power glitch signal detection circuit 100; compared with the resistance-capacitance structure, a negative resistance sluggish characteristic of the latch 110 can detect a glitch signal with a lower amplitude, thereby improving the sensitivity of the power glitch signal detection circuit 100; the static current of the latch 100 is only the leakage current of the used device, and there is no static bias current, which can reduce static power consumption of the power glitch signal detection circuit 100; and the latch 110 can be compatible with a digital CMOS process, which can enhance the portability of the glitch signal detection circuit 100. In short, the power glitch signal detection circuit 100 could detect a power glitch on the power supply voltage or the ground voltage, and the power glitch signal detection circuit 100 has the advantages of low power consumption, small area, high speed, high sensitivity and strong portability.

Based on the technical solution above, when there is no positive power glitch signal on the power supply voltage and no negative power glitch signal on the ground voltage, then the voltage value of the third input does not change, and the signal output module 130 is configured to generate and output a first signal, and the first signal is used to indicate that there is no power glitch signal on the power supply voltage or the ground voltage; when there is a positive power glitch signal on the power supply voltage and/or a negative power glitch signal on the ground voltage, then the voltage value of the third input M changes, and the signal output module 130 is configured to generate and output a second signal according to change of the voltage value of the third input M, and the second signal is used to indicate that there is a power glitch signal on the power supply voltage or the ground voltage.

With continued reference to FIG. 1, the latch 110 may include: a first metal oxide semiconductor (MOS) transistor 111, a second MOS transistor 112, a third MOS transistor 113 and a fourth MOS transistor 114, wherein a source terminal of the first MOS transistor 111 is connected to the power supply voltage, a gate terminal of the first MOS transistor 111 is connected to a gate terminal of the third MOS transistor 113, a drain terminal of the first MOS transistor 111 is connected to a drain terminal of the third MOS transistor 113, a source terminal of the third MOS transistor 113 is connected to the ground voltage, a source terminal of the second MOS transistor 112 is connected to the power supply voltage, a gate terminal of the second MOS transistor 112 is connected to a gate terminal of the fourth MOS transistor 114, a drain terminal of the second MOS transistor 112 is connected to a drain terminal of the fourth MOS transistor 114, a source terminal of the fourth MOS transistor 114 is connected to the ground voltage, the gate terminal of the first MOS transistor 111 is connected to the drain terminal of the second MOS transistor 112, and the gate terminal of the second MOS transistor 112 is connected to the drain terminal of the first MOS transistor 111.

Then, the first input is the source terminal of the first MOS transistor 111 and the source terminal of the second MOS transistor 112, the second input N is the gate terminal of the first MOS transistor 111 and the gate terminal of the third MOS transistor 113, the third input M is the gate terminal of the second MOS transistor 112 and the gate terminal of the fourth MOS transistor 114, the first output is the source terminal of the third MOS transistor 113 and the source terminal of the fourth MOS transistor 114, the second output is the drain terminal of the first MOS transistor 111 and the drain terminal of the third MOS transistor 113, the third output is the drain terminal of the second MOS transistor 112 and the drain terminal of the fourth MOS transistor 114, and the drain terminal of the first MOS transistor 111 or the drain terminal of the second MOS transistor 112 can be connected to the signal output module 130 (the accompanying drawing takes the drain terminal of the first MOS transistor 111 connected to the signal output module 130 as an example).

With continued reference to FIG. 1, the signal output module 130 may be a D trigger. Then, a reset terminal B of the D trigger is connected to a reset signal W, a terminal D of the D trigger is connected to the VDD, a detecting terminal A of the D trigger is connected to the second output of the latch 110 (which is the drain terminal of the first MOS transistor 111) for receiving a detection signal, and a output terminal Q of the D trigger is configured to output a target signal (which is an alarm signal).

Of course, the signal output module 130 may also be other devices, such as a comparator.

It should be understood that, the above description of FIG. 1 is only an exemplary embodiment, and the present disclosure shall not be limited to such embodiment.

For example, the third input M is connected to the second output of the latch 110, therefore, the connection relation of the detecting terminal A of the D trigger and the second output of the latch 110 can also be described in other ways. For example, the detecting terminal A of the D trigger is connected to the third input M; again for example, the detecting terminal A of the D trigger is connected to the second output through the third input M, which are not specifically limited in the embodiments of the present disclosure.

Figure 2:
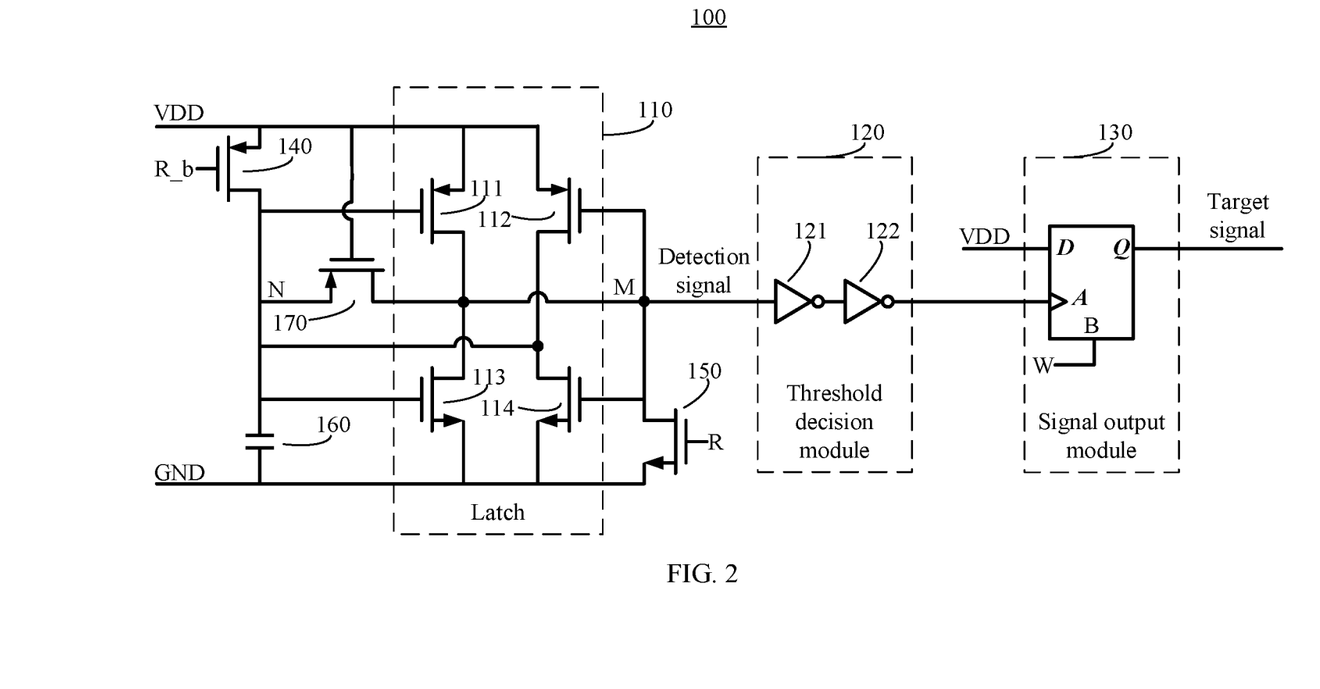

FIG. 2 is a schematic circuit diagram of a power glitch signal detection circuit shown in FIG. 1.

With reference to FIG. 2, the power glitch signal detection circuit further includes a threshold decision module 120, wherein the second output or the third output is connected to the signal output module 130 through the threshold module 120, and the threshold decision module 120 is configured to amplify a signal outputted by the second output or the third output and to transmit the amplified signal to the signal output module 130.

A lower amplitude power glitch can be detected through the latch 110 in cooperation with the threshold decision module 120, which can further increase the sensitivity of the power glitch signal circuit 100.

With continued reference to FIG. 2, the power glitch signal detection circuit 100 further includes a capacitor 160.

The second input N of the latch 110 is connected to the ground voltage through the capacitor 160. That is, after charging the capacitor 160, a voltage value of the second input N of the latch 110 can be made to be "1".

Based on the latch 110-capacitor 160 (Latch-C) structure, the voltage value of the second input N of the latch 110 can be made to be "1". Of course, the capacitor can also be replaced with other energy storage devices, which are not specifically limited in the embodiments of the present disclosure.

In some embodiments of the present disclosure, the power glitch signal detection circuit 100 further includes an enable control circuit, wherein the enable control circuit is configured to control the latch 110 to maintain the voltage value of the second input N at the first voltage, and maintain the voltage value of the third input M at the second voltage. That is, the latch 100 may be a latch with enable control. Of course, the power glitch signal detection circuit 100 may also not include an enable control circuit, in this case, the voltage value of the second input can be maintained at the first voltage and the voltage value of the third input can be maintained at the second voltage by the latch 100 through another control circuit, which are not specifically limited in the embodiments of the present disclosure.

With continued reference to FIG. 2, the enable control circuit may include a sixth MOS transistor 140 and a seventh MOS transistor 150, wherein a source terminal of the sixth MOS transistor 140 is connected to the power supply voltage, a drain terminal of the sixth MOS transistor 150 is connected to the second input N, a source terminal of the seventh MOS transistor 150 is connected to the ground voltage, and a drain terminal of the seventh MOS transistor 150 is connected to the third input M.

For example, a gate terminal of the seventh MOS transistor 150 is configured to receive a first signal R and a gate terminal of the sixth MOS transistor 140 is configured to receive a reverse signal R_b of the first signal R. For example, the first signal R may be a reset signal W received by the reset terminal B of the above-mentioned signal output module 130.

For example, when the first signal R is at a low level, the sixth MOS transistor 140 and the seventh MOS transistor 150 are both turned on, and the power supply voltage charges the capacitor 160 through the sixth MOS transistor 140 so that the first voltage of the second input N is "1", wherein the third input M is connected to the ground through the seventh MOS transistor 150 so that the second voltage of the third input M is "0". When the first signal R is at a high level, the sixth MOS transistor 140 and the seventh MOS transistor 150 are both turned off so that the first voltage of the second input N is maintained at "1" and the second voltage of the third input M is maintained at "0".

That is, the enable control circuit can increase the voltage value of the second input N to VDD through the sixth MOS transistor 140, and decrease the voltage value of the third input M to GND through the seventh MOS transistor 150. When the first signal is 0, states of the second input N and the third input M are maintained unchanged, then the target signal outputted by the signal output module 130 is "0".

Operating principle of the power glitch signal detection circuit 100 is hereinafter described in details with the accompanying drawings.

When there is no power glitch signal on VDD and GND, through the action of the latch 110, the second input N is increased by the second MOS transistor 112 and maintained at "1", and the third input M is decreased by the third MOS transistor 113 and maintained at "0".

Then, static power consumption of the power glitch signal detection circuit 100 is only leakage power consumption of the used device.

When there is a positive glitch on the VDD and the amplitude of the glitch is larger than the threshold voltage of the first MOS transistor 111, the target signal outputted by the signal output module 130 is used to indicate there is a glitch on the power supply voltage or the ground voltage.

With reference to FIG. 2, the voltage of the gate terminal of the first MOS transistor 111 (which is the second input N) is maintained unchanged, then the voltage of the source terminal of the first MOS transistor 111 increases. When the amplitude of the glitch is larger than the threshold voltage of the first MOS transistor 111, the first MOS transistor is turned on, and then starts to charge the third input M to increase its voltage. When the latch 110 triggers the voltage of the second input N decreasing to "0", and the voltage of third input M further increasing to "1", then a detection signal outputted by the threshold decision module 120 is increased to "1". After the signal output module 130 detecting a rising edge of the detection signal, then the output state of the D trigger is updated, that is, the target signal outputted by the signal output module 130 is changed to "1", which is used to indicate that there is a glitch on the power supply voltage or the ground voltage.

When there is a positive glitch on the VDD and the amplitude of the glitch is close to the threshold voltage of the first MOS transistor 111, then the target signal outputted by the signal output module 130 is used to indicate there is a glitch on the power supply voltage or the ground voltage.

With reference to FIG. 2, the voltage of the gate terminal of the first MOS transistor 111 (which is the second input N) is maintained unchanged, then the voltage of the source terminal of the first MOS transistor 111 increases. When the amplitude of the glitch is close to the threshold voltage of the first MOS transistor 111, VDD charges the third input M through the leakage voltage of the drain terminal of the first MOS transistor to increase its voltage, and discharges the second input N through the fourth MOS transistor to decrease its voltage. Since increase of the voltage of the third input M will lead to decrease of the current passing through the first MOS transistor, that is, the voltage of the third input M stops further increasing and the voltage of the second input N stops further decreasing. Through the action of the latch 110, the voltage of the third input M will decrease to "0" over time and the voltage of the second input N will increase to "1" over time. For example, states of voltages of point N and point M can be illustrated as in FIG. 3. The threshold decision module 120 can detect that the voltage of the third input M is maintaining an increasing state in a period of time and determine the state to be "1", that is, a detection signal outputted is increased to "1". For example, the threshold decision module 120 detect a maximum difference V(M)-GND between the voltage of the third input M V(M) and the ground voltage GND is larger or equal to a first threshold voltage Vthn of the threshold decision module 120, then the threshold decision module 120 occurs a signal inversion (from 0 to 1). The D trigger detects a rising edge of the detection signal, then the output state of the D trigger is updated, then target signal outputted by the signal output module 130 is changed to "1", which is used to indicate that there is a glitch on the power supply voltage or the ground voltage.

Figure 3:
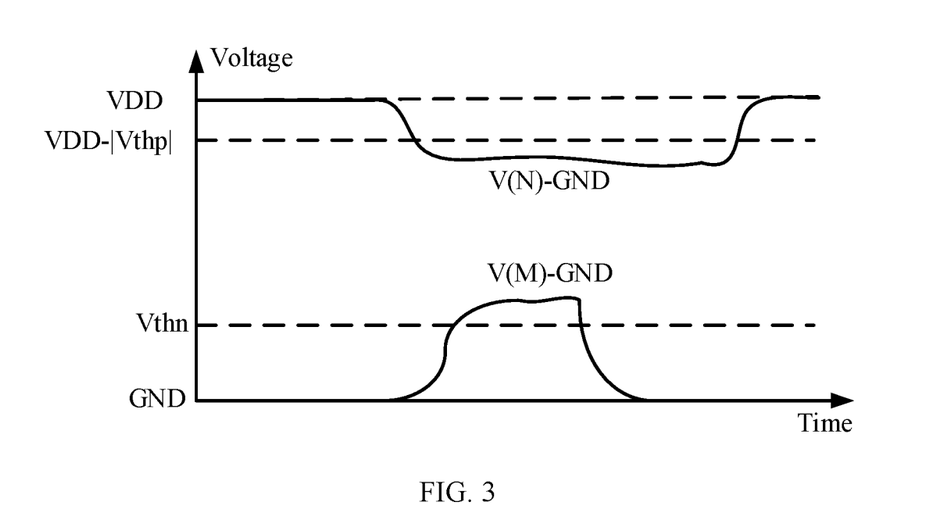
FIG. 3 is a schematic diagram of voltage states of a second input and a third input of a latch of an embodiment of the present disclosure.

It should be understood that, FIG. 3 is only an exemplary embodiment of the present disclosure, and to which the present disclosure shall not be limited.

For example, if the threshold decision module 120 is connected to the second input N of the latch 110, at this time, the threshold decision module 120 detects that the voltage of the second input N is maintaining a decreasing state in a period of time, then determines the state to be "1", that is, a detection signal outputted is increased to "1". For example, the threshold decision module 120 detects a difference between the voltage of the second input N V(N) and the ground voltage GND is less or equal to a difference VDD-|Vthp| between the power supply voltage and a second threshold voltage Vthp of the threshold decision module 120, then the threshold decision module 120 occurs a signal inversion (from 0 to 1). The D trigger of the signal output module 130 detects a failing edge of the detection signal, then the output state of the D trigger is updated, and the target signal outputted by the signal output module 130 is changed to "1", which is used to indicate that there is a glitch on the power supply voltage or the ground voltage.

When there is negative glitch on the GND and the amplitude of the glitch is larger than the threshold voltage of the first MOS transistor 111, the target signal outputted by the signal output module 130 is used to indicate there is a glitch on the power supply voltage or the ground voltage.

With reference to FIG. 2, capacitive coupling causes a decrease of the voltage of the gate terminal of the first MOS transistor 111 and the voltage of the source terminal of the first MOS transistor 111 is maintained unchanged. When the amplitude of the glitch is larger than the threshold voltage of the first MOS transistor 111, the first MOS transistor is turned on, then starts to charge the third input M to increase its voltage, and the voltage of the second input N is decreased by the latch 110, the voltage of the third input M further increased to "1". At this time, a detection signal outputted by the threshold decision module 120 is increased to "1", after the signal output module 130 detecting a rising edge of the detection signal, the output state of the D trigger is updated, that is, the target signal outputted by the signal output module 130 is changed to "1", which is used to indicate that there is a glitch on the power supply voltage or the ground voltage.

When there is a negative glitch on the GND and the amplitude of the glitch is close to the threshold voltage of the first MOS transistor 111, the target signal outputted by the signal output module 130 is used to indicate there is a glitch on the power supply voltage or the ground voltage.

With reference to FIG. 2, capacitive coupling causes a decrease of the voltage of the gate terminal of the first MOS transistor 111 and the voltage of the source terminal of the first MOS transistor 111 is maintained unchanged. When the amplitude of the glitch is close to the threshold voltage of the first MOS transistor 111, the power supply voltage charges the third input M though the first MOS transistor 111 to increase its voltage and discharges the second input N through the fourth MOS transistor 114 to decrease its voltage. Increase of the voltage of the third input M leads to decrease of the current passing through the first MOS transistor 111, that is, the voltage of the third input M stops further increasing and the voltage of the second input N stops further decreasing. Through the action of the latch 110, the voltage of the third input M will decrease to "0" over time and the voltage of the second input N will increase to "1" over time. Specifically, states of voltages of point N and point M can be illustrated as in FIG. 3. The threshold decision module 120 can detect that the voltage of the third input M is maintaining an increasing state in a period of time and determine the state to be "1", that is, a detection signal outputted is increased to "1". The D trigger detects a rising edge of the detection signal, then the output state of the D trigger is updated, then target signal outputted by the signal output module 130 is changed to "1", which is used to indicate that there is a glitch on the power supply voltage or the ground voltage.

With continued reference to FIG. 2, the power glitch signal detection circuit may include a fifth MOS transistor 170, wherein a gate terminal of the fifth MOS transistor 170 is connected to the power supply voltage, a source terminal of the fifth MOS transistor 170 is connected to the second input N; and a drain terminal of the fifth MOS transistor 170 is connected to the third input M. Of course, the drain terminal of the fifth MOS transistor 170 may also be connected to the second output of the latch 110.

For example, when there is no negative power glitch signal on the power supply voltage and no positive power glitch signal on the ground voltage, then the voltage value of the third input M does not change, and the signal output module 130 is configured to generate and output a third signal, and the third signal is used to indicate that there is no power glitch signal on the power supply voltage or the ground voltage; wherein when there is a negative power glitch signal on the power supply voltage and/or a negative power glitch signal on the ground voltage, then the voltage value of the third input M changes, and the signal output module 130 is configured to generate and output a fourth signal according to change of the voltage value of the third input, and the fourth signal is used to indicate that there is a power glitch signal on the power supply voltage or the ground voltage.

That is, the negative power glitch signal on the power supply voltage and the positive power glitch signal on the ground voltage can be detected using the fifth MOS transistor 170. In other word, bidirectional power glitch detection can be implemented with the latch 110 in cooperation with the fifth MOS transistor 170.

Specifically, when there is a negative glitch on the VDD and the amplitude of the glitch is larger than the threshold voltage of the fifth MOS transistor 170, the target signal outputted by the signal output module 130 is used to indicate there is a glitch on the power supply voltage or the ground voltage.

With reference to FIG. 2, the voltage of the source terminal of the fifth MOS transistor 170 (which is the second input N) is maintained unchanged, and the voltage of the gate terminal of the fifth MOS transistor 170 decreases. When the amplitude of the glitch is larger than the threshold voltage of the fifth MOS transistor 170, the fifth MOS transistor 170 is turned on, the capacitor 160 charges the third input M through the fifth MOS transistor 170 to increase its voltage, at the same time, after charge distribution, the voltage of the second input N decreases. The latch 110 further decreases the voltage of the second input N to "0", and further increases the voltage of the third input M to "1". At this time, a detection signal outputted by the threshold decision module 120 is increased to "1", after the signal output module 130 detecting a rising edge of the detection signal, the output state of the D trigger is updated, that is, the target signal outputted by the signal output module 130 is changed to "1", which is used to indicate that there is a glitch on the power supply voltage or the ground voltage.

When there is a negative glitch on the VDD and the amplitude of the glitch is close to the threshold voltage of the fifth MOS transistor 170, and the target signal outputted by the signal output module 130 is used to indicate there is a glitch on the power supply voltage or the ground voltage.

With reference to FIG. 2, the voltage of the source terminal of the fifth MOS transistor 170 (which is the second input N) is maintained unchanged, and the voltage of the gate terminal of the fifth MOS transistor 170 decreases. When the amplitude of the glitch is close to the threshold voltage of the fifth MOS transistor 170, the capacitor 160 charges the third input M through the fifth MOS transistor 170 to increase its voltage, at the same time, after charge distribution, the voltage of the second input N decreases. Increase of the voltage of the third input M will lead to decrease of the current passing through the first MOS transistor 170, that is, the voltage of the third input M stops further increasing and the voltage of the second input N stops further decreasing. Through the action of the latch 110, the voltage of the third input M will decrease to "0" over time and the voltage of the second input N will increase to "1" over time. Specifically, states of voltages of point N and point M can be illustrated as in FIG. 3. The threshold decision module 120 can detect that the voltage of the third input M is maintaining an increasing state in a period of time and determine the state to be "1", that is, a detection signal outputted is increased to "1". The D trigger detects a rising edge of the detection signal, then the output state of the D trigger is updated, and then target signal outputted by the signal output module 130 is changed to "1", which is used to indicate that there is a glitch on the power supply voltage or the ground voltage.

When there is a positive glitch on the GND and the amplitude of the glitch is larger than the threshold voltage of the fifth MOS transistor 170, the target signal outputted by the signal output module 130 is used to indicate there is a glitch on the power supply voltage or the ground voltage.

With reference to FIG. 2, the voltage of the source terminal of the fifth MOS transistor 170 (which is the second input N) increases, and the voltage of the gate terminal of the fifth MOS transistor 170 is maintained unchanged. When the amplitude of the glitch is larger than the threshold voltage of the fifth MOS transistor 170, the fifth MOS transistor 170 is turned on, the capacitor 160 charges the third input M through the fifth MOS transistor 170 to increase its voltage, at the same time, after charge distribution, the voltage of the second input N decreases, the latch 110 further decreases the voltage of the second input N to "0", and further increases the voltage of the third input M to "1". At this time, a detection signal outputted by the threshold decision module 120 is increased to "1", after the signal output module 130 detecting a rising edge of the detection signal, the output state of the D trigger is updated, that is, the target signal outputted by the signal output module 130 is changed to "1", which is used to indicate that there is a glitch on the power supply voltage or the ground voltage.

When there is a negative glitch on the VDD and the amplitude of the glitch is close to the threshold voltage of the fifth MOS transistor 170, and the target signal outputted by the signal output module 130 is used to indicate there is a glitch on the power supply voltage or the ground voltage.

With reference to FIG. 2, the voltage of the source terminal of the fifth MOS transistor 170 (which is the second input N) increases, and the voltage of the gate terminal of the fifth MOS transistor 170 is maintained unchanged. When the amplitude of the glitch is larger than the threshold voltage of the fifth MOS transistor 170, the capacitor 160 charges the point M through the fifth MOS transistor 170 to increase its voltage, at the same time, after charge distribution, the voltage of the point N decreases. When the amplitude of the glitch is larger than the threshold voltage of the fifth MOS transistor 170, the fifth MOS transistor 170 is turned on, the capacitor 160 charges the third input M through the fifth MOS transistor 170 to increase its voltage, at the same time, after charge distribution, the voltage of the second input N decreases. Increase of the voltage of the third input M leads to decrease of the current passing through the first MOS transistor 170, that is, the voltage of the third input M stops further increasing and the voltage of the second input N stops further decreasing. Through the action of the latch 110, the voltage of the third input M will decrease to "0" over time and the voltage of the second input N will increase to "1" over time. Specifically, states of voltages of point N and point M can be illustrated as in FIG. 3. The threshold decision module 120 can detect that the voltage of the third input M is maintaining an increasing state in a period of time and determine the state to be "1", that is, a detection signal outputted is increased to "1". The D trigger detects a rising edge of the detection signal, then the output state of the D trigger is updated, and then target signal outputted by the signal output module 130 is changed to "1", which is used to indicate that there is a glitch on the power supply voltage or the ground voltage.

Figure 4:
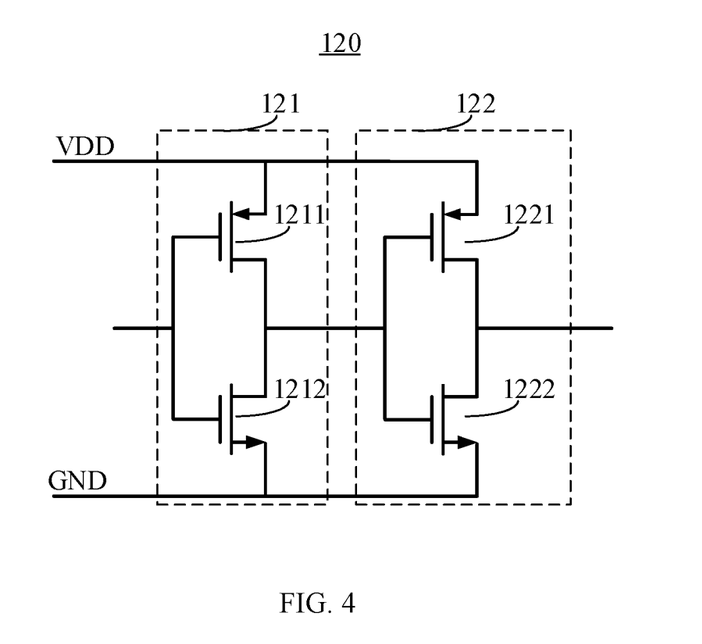
FIG. 4 is a schematic circuit diagram of a threshold decision module of an embodiment of the present disclosure.

FIG. 4 is a schematic circuit diagram of a threshold decision module 120 of an embodiment of the present disclosure.

With reference to FIG. 4, the threshold decision module 120 includes: an eighth MOS transistor 1211, a ninth MOS transistor 1221, a tenth MOS transistor 1212 and an eleventh MOS transistor, wherein a source terminal of the eighth MOS transistor 1211 is connected to the power supply voltage, a gate terminal of the eighth MOS transistor 1211 is connected to a gate terminal of the tenth MOS transistor 1212, a drain terminal of the eighth MOS transistor 1211 is connected to a drain of the tenth MOS transistor 1212, a source terminal of the tenth MOS transistor 1212 is connected to the ground voltage, a source terminal of the ninth MOS transistor 1221 is connected to the power supply voltage, a gate terminal of the ninth MOS transistor 1221 is connected to a gate of the eleventh MOS transistor 1222, a drain terminal of the ninth MOS transistor 1221 is connected to a drain terminal of the eleventh MOS transistor 1222, a source terminal of the eleventh MOS terminal 1222 is connected to the ground voltage, the drain terminal of the eighth MOS transistor 1211 is connected to the gate terminal of the ninth MOS transistor 1221, the gate terminal of the eighth MOS transistor 1211 is connected to the second output or the third output, and the gate terminal of the ninth MOS transistor 1221 is connected to the signal output module 130.

Optionally, the width to length ratio of the eighth MOS transistor 1211 is less than a first preset threshold, the width to length ratio of the ninth MOS transistor 1221 is greater than a second preset threshold, the width of length ratio of the tenth MOS transistor 1212 is greater than a third preset threshold, the width to length ratio of the eleventh MOS transistor 1222 is less than a fourth preset threshold, wherein, the first preset threshold is less or equal to the third preset threshold and the second preset threshold is greater or equal to the fourth preset threshold, in order to improve the amplification of the threshold decision module 120 so that the sensitivity of the power glitch signal detection circuit 100 can be increased.

Or, the eight MOS transistor 1211 and the tenth MOS transistor 1212 form a first inverter, and the ninth MOS transistor 1221 and the eleventh MOS transistor 1222 form a second inverter, wherein an inverting threshold of the first inverter is less than that of the second inverter. For example, the inverting threshold of the first inverter is 0.3, and the inverting threshold of the second inverter is 0.8, that is, reducing the inverting threshold of the first inverter to increase the sensitivity of the power glitch signal detection circuit 100, further, amplifying the inverting threshold of the second inverter to ensure the stability of the power glitch signal detection circuit 100.

It should be understood that 0.3 and 0.8 are only exemplary embodiments, and the inverting threshold of the first inverter and the inverting threshold of the second inverter are not specifically limited in the present disclosure.

The present disclosure also provides an electronic apparatus, wherein the electronic apparatus may include the above-mentioned power glitch signal detection circuit.

It should be understood that the above-mentioned MOS transistor may be a Metal-Oxide-Semiconductor Field-Effect Transistor (MOSFET). Such as N-type MOS transistor (NMOSFET) and P-type MOS transistor (PMOSFET). When N-type MOS transistor and P-type MOS transistor are used as switches, the N-type MOS transistor (a MOS transistor with a substrate PN junction pointing inward or a MOS transistor with a current flowing out) is turned on when the gate terminal is connected to the high voltage, and is turned off when the gate terminal is connected to the low voltage; the P-type MOS transistor (a MOS transistor with a PN junction pointing outward or a MOS transistor with a current flowing in) is turned off when the gate terminal is connected to a high voltage and turned on when the gate terminal is connected to a low voltage.

It should also be understood that, FIG. 1 to FIG. 4 are only some exemplary embodiments of the present disclosure, and the present disclosure is not limited to such embodiments.

For example, alternatively, the third output terminal may also be connected to the signal output module 130.

Those skilled in the art may be aware that the units and circuits of the examples described in combination with the embodiments disclosed herein can be implemented by electronic hardware or a combination of computer software and electronic hardware. Whether these functions are executed by hardware or software depends on the specific application and constraints of design of the technical solution. Professionals can use different methods for each specific application to implement the described functions, but such implementation should not be considered beyond the scope of this application.

In several embodiments provided in the present disclosure, it should be understood that the disclosed circuits, branches, and modules may be implemented in other ways. For example, the branches described above are schematic. For example, the division of the modules is only a division of logical functions, and there may be other divisions in actual implementation. For example, multiple modules can be combined or integrated into one branch, or some features can be ignored or not implemented.

If the integrated module is implemented in the form of a software functional unit and sold or used as an independent product, it can be stored in a computer readable storage medium. Based on such understanding, the technical solution provided by the present essentially or the part that contributes to prior art or the part of the technical solution can be embodied in the form of a software product, and the computer software product is stored in a storage medium, including instructions that can be used to make a computer device (which may be a personal computer, a server, or a network device, etc.) execute all or part of the steps of the method described in each embodiment of the present disclosure. And above-mentioned storage media include: U disk, portable hard disk, Read-Only Memory (ROM), Random Access Memory (RAM), magnetic disk or optical disk and other media that can store program code.

The above description is only specific embodiments of the present disclosure, but the protection scope of the present invention is not limited thereto, any skilled who is familiar with this art could readily conceive variations or substitutions within the disclosed technical scope disclosed by the present disclosure, and these variations or substitutions shall be encompassed in the protection scope of the present disclosure. Thus, the protection scope of the present disclosure shall be subjected to the protection scope of the claims.

What is claimed is:

1. A power glitch signal detection circuit, comprising:
a latch and a signal output module,
wherein a first input of the latch is connected to a power supply voltage, a first output of the latch is connected to a ground voltage, a second input of the latch is connected to a third output of the latch, a third input of the latch is connected to a second output of the latch, and the second output or the third output is connected to the signal output module;
wherein when there is no power glitch signal on the power supply voltage and no power glitch signal on the ground voltage, the latch is configured to maintain a voltage value of the second input at a first voltage and maintain a voltage value of the third input at a second voltage, wherein the first voltage is greater or less than the second voltage;
wherein the signal output module is configured to generate and output a target signal according to change of a voltage value of the third input, and the target signal is used to indicate whether there is a power glitch signal on the power supply voltage or the ground voltage.

2. The power glitch signal detection circuit according to claim 1, wherein when there is no positive power glitch signal on the power supply voltage and no negative power glitch signal on the ground voltage, then the voltage value of the third input does not change, the signal output module is configured to generate and output a first signal, and the first signal is used to indicate that there is no power glitch signal on the power supply voltage or the ground voltage; when there is a positive power glitch signal on the power supply voltage and/or a negative power glitch signal on the ground voltage, then the voltage value of the third input changes, the signal output module is configured to generate and output a second signal according to the change of the voltage value of the third input, and the second signal is used to indicate that there is a power glitch signal on the power supply voltage or the ground voltage.

3. The power glitch signal detection circuit according to claim 1, wherein the power glitch signal detection circuit further comprises:
a capacitor, wherein the second input of the latch is connected to the ground voltage through the capacitor.

4. The power glitch signal detection circuit according to claim 1, wherein the latch comprises:
a first metal oxide semiconductor (MOS) transistor, a second MOS transistor, a third MOS transistor and a fourth MOS transistor, wherein a source terminal of the first MOS transistor is connected to the power supply voltage, a gate terminal of the first MOS transistor is connected to a gate terminal of the third MOS transistor; a drain terminal of the first MOS transistor is connected to a drain terminal of the third MOS transistor, a source terminal of the third MOS transistor is connected to the ground voltage, a source terminal of the second MOS transistor is connected to the power supply voltage, a gate terminal of the second MOS transistor is connected to a gate terminal of the fourth MOS transistor, a drain terminal of the second MOS transistor is connected to a drain terminal of the fourth MOS transistor, a source terminal of the fourth MOS terminal is connected to the ground voltage, a gate terminal of the first MOS transistor is connected to a drain terminal of the second MOS transistor, and a gate terminal of the second MOS transistor is connected to a drain terminal of the first MOS transistor.

5. The power glitch signal detection circuit according to claim 1, wherein the power glitch signal detection circuit further comprises:
a fifth MOS transistor, wherein a gate terminal of the fifth MOS transistor is connected to the power supply voltage, a source terminal of the fifth MOS transistor is connected to the second input; and a drain terminal of the fifth MOS transistor is connected to the third input.

6. The power glitch signal detection circuit according to claim 5, wherein when there is no negative power glitch signal on the power supply voltage and no positive power glitch signal on the ground voltage, then the voltage value of the third input does not change, and the signal output module is configured to generate and output a third signal, and the third signal is used to indicate that there is no power glitch signal on the power supply voltage or the ground voltage; when there is a negative power glitch signal on the power supply voltage and/or a positive power glitch signal on the ground voltage, then the voltage value of the third input changes, and the signal output module is configured to generate and output a fourth signal according to the change of the voltage value of the third input, and the fourth signal is used to indicate that there is a power glitch signal on the power supply voltage or the ground voltage.

7. The power glitch signal detection circuit according to claim 1, wherein the power glitch signal detection circuit further comprises:
an enable control circuit, wherein the enable control circuit is configured to control the latch to maintain the voltage value of the second input at the first voltage, and maintain the voltage value of the third input at the second voltage.

8. The power glitch signal detection circuit according to claim 7, wherein the enable control circuit comprises:
a sixth MOS transistor and a seventh MOS transistor, wherein a source terminal of the sixth MOS transistor is connected to the power supply voltage, a drain terminal of the sixth MOS transistor is connected to the second input, a source terminal of the seventh MOS transistor is connected to the ground voltage, and a drain terminal of the seventh MOS transistor is connected to the third input.

9. The power glitch signal detection circuit according to claim 1, wherein the signal output module is a D trigger.

10. The power glitch signal detection circuit according to claim 1, wherein the power glitch signal detection circuit further comprises:
a threshold decision module, wherein the second output or the third output is connected to the signal output module through the threshold module, and the threshold decision module is configured to amplify a signal sent from the second output or the third output and to transmit the amplified signal to the signal output module.

11. The power glitch signal detection circuit according to claim 10, wherein the threshold decision module comprises:
an eighth MOS transistor, a ninth MOS transistor, a tenth MOS transistor and an eleventh MOS transistor, wherein a source terminal of the eighth MOS transistor is connected to the power supply voltage, a gate terminal of the eighth MOS transistor is connected to a gate terminal of the tenth MOS transistor, a drain terminal of the eighth MOS transistor is connected to a drain terminal of the tenth MOS transistor, a source terminal of the tenth MOS transistor is connected to the ground voltage, a source terminal of the ninth MOS transistor is connected to the power supply voltage, a gate terminal of the ninth MOS transistor is connected to a gate terminal of the eleventh MOS transistor, a drain terminal of the ninth MOS transistor is connected to a drain terminal of the eleventh MOS transistor, a source terminal of the eleventh MOS terminal is connected to the ground voltage, a drain terminal of the eighth MOS transistor is connected to a gate terminal of the ninth MOS transistor, and a gate terminal of the eighth MOS transistor is connected to the second output or the third output, and a gate terminal of the ninth MOS transistor is connected to the signal output module.

12. The power glitch signal detection circuit according to claim 11, wherein the eight MOS transistor and the tenth MOS transistor form a first inverter, and the ninth MOS transistor and the eleventh MOS transistor form a second inverter, wherein an inverting threshold of the first inverter is less than that of the second inverter.

13. A security chip, comprising a power glitch signal detection circuit, wherein the power glitch signal detection circuit comprises:
   a latch and a signal output module,
   wherein a first input of the latch is connected to a power supply voltage, a first output of the latch is connected to a ground voltage, a second input of the latch is connected to a third output of the latch, a third input of the latch is connected to a second output of the latch, and the second output or the third output is connected to the signal output module;
   wherein when there is no power glitch signal on the power supply voltage and no power glitch signal on the ground voltage, the latch is configured to maintain a voltage value of the second input at a first voltage and maintain a voltage value of the third input at a second voltage, wherein the first voltage is greater or less than the second voltage;
   wherein the signal output module is configured to generate and output a target signal according to change of a voltage value of the third input, and the target signal is used to indicate whether there is a power glitch signal on the power supply voltage or the ground voltage.

14. The security chip according to claim 13, wherein when there is no positive power glitch signal on the power supply voltage and no negative power glitch signal on the ground voltage, then the voltage value of the third input does not change, the signal output module is configured to generate and output a first signal, and the first signal is used to indicate that there is no power glitch signal on the power supply voltage or the ground voltage; when there is a positive power glitch signal on the power supply voltage and/or a negative power glitch signal on the ground voltage, then the voltage value of the third input changes, the signal output module is configured to generate and output a second signal according to the change of the voltage value of the third input, and the second signal is used to indicate that there is a power glitch signal on the power supply voltage or the ground voltage.

15. The security chip according to claim 13, wherein the power glitch signal detection circuit further comprises:
   a capacitor, wherein the second input of the latch is connected to the ground voltage through the capacitor.

16. The security chip according to claim 13, wherein the latch comprises:
   a first MOS transistor, a second MOS transistor, a third MOS transistor and a fourth MOS transistor, wherein a source terminal of the first MOS transistor is connected to the power supply voltage, a gate terminal of the first MOS transistor is connected to a gate terminal of the third MOS transistor; a drain terminal of the first MOS transistor is connected to a drain terminal of the third MOS transistor, a source terminal of the third MOS transistor is connected to the ground voltage, a source terminal of the second MOS transistor is connected to the power supply voltage, a gate terminal of the second MOS transistor is connected to a gate terminal of the fourth MOS transistor, a drain terminal of the second MOS transistor is connected to a drain terminal of the fourth MOS transistor, a source terminal of the fourth MOS terminal is connected to the ground voltage, a gate terminal of the first MOS transistor is connected to a drain terminal of the second MOS transistor, and a gate terminal of the second MOS transistor is connected to a drain terminal of the first MOS transistor.

17. The security chip according to claim 13, wherein the power glitch signal detection circuit further comprises:
   a fifth MOS transistor, wherein a gate terminal of the fifth MOS transistor is connected to the power supply voltage, a source terminal of the fifth MOS transistor is connected to the second input; and a drain terminal of the fifth MOS transistor is connected to the third input.

18. The security chip according to claim 17, wherein when there is no negative power glitch signal on the power supply voltage and no positive power glitch signal on the ground voltage, then the voltage value of the third input does not change, and the signal output module is configured to generate and output a third signal, and the third signal is used to indicate that there is no power glitch signal on the power supply voltage or the ground voltage; when there is a negative power glitch signal on the power supply voltage and/or a positive power glitch signal on the ground voltage, then the voltage value of the third input changes, and the signal output module is configured to generate and output a fourth signal according to the change of the voltage value of the third input, and the fourth signal is used to indicate that there is a power glitch signal on the power supply voltage or the ground voltage.

19. The security chip according to claim 13, wherein the power glitch signal detection circuit further comprises:
   an enable control circuit, wherein the enable control circuit is configured to control the latch to maintain the voltage value of the second input at the first voltage, and maintain the voltage value of the third input at the second voltage.

20. The security chip according to claim 19, wherein the enable control circuit comprises:
   a sixth MOS transistor and a seventh MOS transistor, wherein a source terminal of the sixth MOS transistor is connected to the power supply voltage, a drain terminal of the sixth MOS transistor is connected to the second input, a source terminal of the seventh MOS transistor is connected to the ground voltage, and a drain terminal of the seventh MOS transistor is connected to the third input.

* * * * *